(12) United States Patent
Mizumura et al.

(10) Patent No.: US 8,999,865 B2
(45) Date of Patent: Apr. 7, 2015

(54) LASER ANNEALING APPARATUS AND LASER ANNEALING METHOD

(71) Applicant: V Technology Co., Ltd., Yokohama-shi (JP)

(72) Inventors: Michinobu Mizumura, Yokohama (JP); Yuji Saito, Yokohama (JP)

(73) Assignee: V Technology Co., Ltd., Yokohama-Shi, Kanagawa (JP)

( * ) Notice: Subject to any disclaimer, the term of this patent is extended or adjusted under 35 U.S.C. 154(b) by 23 days.

(21) Appl. No.: 13/912,134

(22) Filed: Jun. 6, 2013

(65) Prior Publication Data

US 2013/0273749 A1 Oct. 17, 2013

Related U.S. Application Data

(63) Continuation of application No. PCT/JP2011/076921, filed on Nov. 22, 2011.

(30) Foreign Application Priority Data

Dec. 9, 2010 (JP) ................. 2010-274659

(51) Int. Cl.
*H01L 21/26* (2006.01)
*H01L 21/42* (2006.01)
(Continued)

(52) U.S. Cl.
CPC ...... *H01L 21/67115* (2013.01); *B23K 26/0656* (2013.01); *B23K 26/0676* (2013.01); *H01L 21/02532* (2013.01); *H01L 21/0268* (2013.01); *H01L 21/02691* (2013.01); *H01L 21/477* (2013.01); *B23K 2201/40* (2013.01)

(58) Field of Classification Search
USPC .................. 438/795, 798; 219/121.6, 121.65, 219/121.85
See application file for complete search history.

(56) References Cited

U.S. PATENT DOCUMENTS 5,689,327 A 11/1997 Takeda
7,521,337 B2 * 4/2009 Sekiya et al. ................. 438/463
(Continued)

FOREIGN PATENT DOCUMENTS

JP 55-112194 8/1980
JP 01-293582 11/1989
(Continued)

OTHER PUBLICATIONS

International Search Report for International Application No. PCT/JP2011/076921 mailed Feb. 7, 2012.

*Primary Examiner* — Alexander Ghyka
(74) *Attorney, Agent, or Firm* — McDermott Will & Emery LLP (57) ABSTRACT

A laser annealing apparatus carries out an annealing treatment an amorphous silicon film on a TFT substrate. The apparatus includes: a mask having a plurality of apertures; a microlens substrate having a plurality of microlenses arranged on a surface thereof and configured to focus the plurality of laser beams Lb, that have passed through the respective apertures of the mask, onto the TFT substrate to apply a predetermined energy to the amorphous silicon film; a pair of guides each having a semi-cylindrical shape and disposed along both sides across the microlens substrate so that the axes of the guides are parallel to each other and that the tips of the guides protrude from the positions of tips of the microlenses toward the TFT substrate; and a film that is provided in a tensioned state between the pair of guides so as to be movable and that transmits a laser beam.

6 Claims, 5 Drawing Sheets (51) Int. Cl.
*H01L 21/67* (2006.01)
*B23K 26/06* (2014.01)
*B23K 26/067* (2006.01)
*H01L 21/02* (2006.01)
*H01L 21/477* (2006.01)

(56) References Cited

U.S. PATENT DOCUMENTS

| | | | | |
|---|---|---|---|---|
| 7,580,136 | B2* | 8/2009 | Sawabe et al. | 356/614 |
| 8,847,108 | B2* | 9/2014 | Kobayashi et al. | 219/121.67 |
| 2001/0009251 | A1* | 7/2001 | Sekizawa et al. | 219/121.73 |
| 2003/0116544 | A1* | 6/2003 | Yamamoto | 219/121.71 |
| 2006/0255022 | A1* | 11/2006 | Hoshino et al. | 219/121.69 |
| 2008/0057718 | A1 | 3/2008 | Omata et al. | |
| 2008/0061042 | A1* | 3/2008 | Nomaru | 219/121.67 |
| 2009/0064521 | A1* | 3/2009 | Sawabe et al. | 33/645 |
| 2009/0277889 | A1* | 11/2009 | Kobayashi et al. | 219/121.67 |
| 2012/0220140 | A1* | 8/2012 | Kajiyama et al. | 438/795 |
| 2014/0135748 | A1* | 5/2014 | Dai et al. | 606/5 |

FOREIGN PATENT DOCUMENTS

| | | |
|---|---|---|
| JP | 07-100670 | 4/1995 |
| JP | 08-066790 | 3/1996 |
| JP | 2001-269789 A | 10/2001 |
| JP | 2002-035985 A | 2/2002 |
| JP | 2004-311906 A | 11/2004 |
| JP | 2008-055467 A | 3/2008 |
| WO | 2010/140505 A1 | 12/2010 |

* cited by examiner

LASER ANNEALING APPARATUS AND LASER ANNEALING METHOD

CROSS-REFERENCE TO RELATED APPLICATION

This application is a continuation application of PCT/JP2011/076921, filed on Nov. 22, 2011.

BACKGROUND OF THE INVENTION

1. Field of the Invention

The present invention relates to a laser annealing apparatus that irradiates an amorphous silicon film formed on a substrate with a plurality of laser beams through a plurality of microlenses to carry out a laser annealing treatment, and in particular, relates to a laser annealing apparatus and a laser annealing method, which facilitate maintenance and control of irradiation energy of the laser beams and enable suppression of shape disturbances in irradiation patterns.

2. Description of Related Art

Conventionally, this sort of laser annealing apparatus is one which forms a plurality of laser beams and forms a focal point for each beam by a microlens array, projects the focal point of each beam by a reduction optical system to form an image on an amorphous silicon film surface side, and thereby conducts a laser treatment by irradiation of the beams onto the amorphous silicon film surface, to change the amorphous silicon film in the thin-film transistor (hereinafter, referred to as "TFT") forming area into polysilicon. On an underside of the reduction optical system, a quartz plate is provided as a protection member to prevent contaminants which spread during an annealing treatment from adhering to the optical system (for example, refer to Japanese Laid-Open (Kokai) Patent Application Publication No. 2004-311906).

Furthermore, as an optical system protection device for preventing such contaminants from adhering to the optical system, there is an apparatus for focusing a laser beam by a condenser lens onto an object to be processed to conduct a process, the apparatus has a film provided between a reel-in reel and a reel-out reel and transmitting a laser beam so that it can be moved between the condenser lens and the object to be processed (for example, refer to Japanese Laid-Open (Kokai) Patent Application Publication No. H07-100670).

In the laser annealing apparatus described in Japanese Laid-Open (Kokai) Patent Application Publication No. 2004-311906, since a quartz plate is employed as a protection member for preventing contaminants from adhering to the optical system, it is possible to form the surface of the quartz plate to be flat and no shape disturbance of irradiation pattern occurs. However, there is a problem that a contaminated quartz plate needs to be replaced every time after a certain duration of use, and such work is troublesome. Accordingly, there has been a problem that it is not possible to maintain high irradiation energy of the laser beams stably for long periods.

Furthermore, in the optical system protection device described in Japanese Laid-Open (Kokai) Patent Application Publication No. H07-100670, a film is provided between a condenser lens and an object to be processed so that the film can be moved, and accordingly, there is an advantage in that it is not necessary to replace the film every time after a certain period of use, and that the maintenance is easy. However, since a pair of rolls guiding the film are not disposed along both sides across the condenser lens, and since the distance between the pair of rolls is long, there is a problem that longitudinal wrinkles parallel to the moving direction tend to be formed in the film between the rolls when a back tension is applied to the film. Accordingly, when such an optical system protection device is applied to the laser annealing apparatus of Japanese Laid-Open (Kokai) Patent Application Publication No. 2004-311906, there is a problem that the longitudinal wrinkles cause disturbance of irradiation pattern of the laser beams radiated onto a substrate, to prevent formation of each TFT-forming area into a predetermined shape in the annealing treatment.

SUMMARY OF THE INVENTION

Under these circumstances, it is an object of the present invention to address the problems and to provide a laser annealing apparatus and a laser annealing method that facilitate maintenance and control of irradiation energy of laser beams and that enable suppression of shape disturbances in irradiation patterns.

In order to achieve the above objects, the laser annealing apparatus of an aspect of the present invention irradiates an amorphous silicon film formed on a substrate with a plurality of laser beams to carry out an annealing treatment. The laser annealing apparatus includes: a mask having a plurality of apertures each having a shape similar to that of an area of the substrate to be annealed; a microlens substrate having a plurality of microlenses arranged on a plane and configured to focus the plurality of laser beams, that have passed through the respective apertures of the mask, onto the substrate to apply a predetermined energy to the amorphous silicon film; a pair of guides each having a semi-cylindrical shape and disposed along both sides across the microlens substrate so that the axes of the guides are parallel to each other and that the tips of the guides protrude from the positions of tips of the microlenses toward the substrate; and a film that is provided in a tensioned state between the pair of guides so as to be movable and that transmits the laser beams.

By such a configuration, a plurality of laser beams, which have passed through respective apertures of a mask having a plurality of apertures each having a shape similar to that of an area of the substrate to be annealed, are focused by a plurality of microlenses arranged on a plane onto a substrate to apply a predetermined energy to an amorphous silicon film to carry out an annealing treatment. Here, the apparatus employs a pair of guides each having a semi-cylindrical shape and disposed along both sides across the microlens substrate so that the axes of the guides are parallel to each other and that the tips of the guides protrude from the positions of tips of the microlenses toward the substrate, and a film, that transmits the laser beams, is provided so as to be movable in a tensioned state between the pair of guides to thereby suppress adhesion of contaminants to a microlens substrate surface.

Furthermore, the laser annealing apparatus further includes a reel-out reel, that is disposed on one side of the mask and reels out the film, and a reel-in reel, that is disposed on the other side of the mask and reels in the film, so that the film can be moved continuously at a constant speed or intermittently with a constant amount at constant time intervals in a state that a constant back tension is applied to the film between the pair of guides.

Furthermore, the laser annealing apparatus further includes a scanning device for moving the substrate in a direction intersecting the axes of the pair of guides at a constant speed.

Furthermore, the substrate is a thin-film transistor (hereinafter, referred to as "TFT") substrate for a display device, and the area to be annealed is a TFT-forming area.

Furthermore, the microlenses are each formed so as to have a focal point between the top of the microlens and the film or between the film and the mask.

Furthermore, the laser annealing method of an aspect of the present invention is a laser annealing method of irradiating an amorphous silicon film formed on a substrate with a plurality of laser beams through a mask having a plurality of apertures each having a predetermined shape and a microlens substrate having a plurality of microlenses formed so as to correspond to the plurality of apertures, to carry out an annealing treatment. The laser annealing method includes steps of: moving a film, that is provided in a tensioned state between a pair of guides so as to be movable and that transmits the laser beams, in a direction intersecting the axes of the pair of guides, the pair of guides each having a semi-cylindrical shape and disposed along both sides across the microlens substrate so that the axes of the guides are parallel to each other and that the tips of the guides protrude from the positions of tips of the microlenses toward the substrate; moving the substrate in the moving direction of the film at a constant speed in a state in which the substrate faces to the microlens substrate; and focusing the plurality of laser beams that have passed through the plurality of microlenses and have been transmitted through the film, onto the substrate to apply the amorphous silicon film with a predetermined optical energy.

According to first and second aspects of the present invention, since a film is provided between the microlens substrate and the substrate so as to be movable in order to prevent contaminants from adhering to a surface of the microlens substrate, it is not necessary to frequently change the film and it is possible to easily maintain and control irradiation energy of laser beams. Furthermore, since the film is supported by a pair of guides disposed across the microlens substrate, it is possible to make the distance between the pair of guides far shorter than the distance between a pair of guides of prior arts, thus enabling to suppress generation of longitudinal wrinkles parallel to the moving direction of the film and to suppress shape disturbance of irradiation pattern. Accordingly, it is possible to carry out an annealing treatment to the areas to be annealed with good shape accuracy.

Furthermore, according to a third aspect of the present invention, since the laser annealing treatment is carried out while the substrate is moved at a constant speed, it is possible to carry out a laser annealing treatment of a large-sized substrate by using a small mask, thus reducing the cost of the laser annealing treatment. Furthermore, it is also possible to reduce the takt of an annealing treatment step to large substrates.

Furthermore, according to a fourth aspect of the present invention, it is possible to carry out an annealing treatment uniformly to TFT-forming areas of a TFT device for a display. Accordingly, it is possible to make operation performances of thin-film transistors substantially uniform over the entire display area to thereby improve quality of displayed image.

Furthermore, according to a fifth aspect of the present invention, it is possible to suppress generation of an energy loss caused by absorption of a part of laser energy into a silicon vapor floating between a substrate surface and the film. Furthermore, since the focal point is not present on the film, laser energy is not concentrated on the film, and it is possible to prevent burning of the film.

Furthermore, according to a sixth aspect of the present invention, since a film is provided between the microlens substrate and the substrate so as to be movable in order to prevent contaminants from adhering to a surface of the microlens substrate, it is not necessary to frequently replace the film and it is possible to easily maintain and control irradiation energy of the laser beams. Furthermore, since the film is supported by a pair of guides disposed across the microlens substrate, it is possible to make the distance between the pair of guides far shorter than the distance between a pair of guides of the prior art, thus enabling suppression of the generation of longitudinal wrinkles parallel to the moving direction of the film and to suppress shape disturbances in irradiation patterns. Accordingly, it is possible to carry out an annealing treatment on areas to be annealed with good shape accuracy. Furthermore, since the laser annealing treatment is carried out while the substrate is moved at a constant speed, it is possible to carry out a laser annealing treatment of a large-sized substrate by using a small mask, thus reducing the cost of the laser annealing treatment. Furthermore, it is also possible to reduce the takt of an annealing treatment step to large substrates.

BRIEF DESCRIPTION OF THE DRAWINGS

FIGS. 3A and 3B are views illustrating an assembly construction example of a mask and a microlens substrate to be employed for the laser annealing apparatus according to the present invention, in which

DESCRIPTION OF THE PREFERRED EMBODIMENTS

Next, embodiments of the present invention will be described in detail with reference to the attached drawings.

Figure 1:
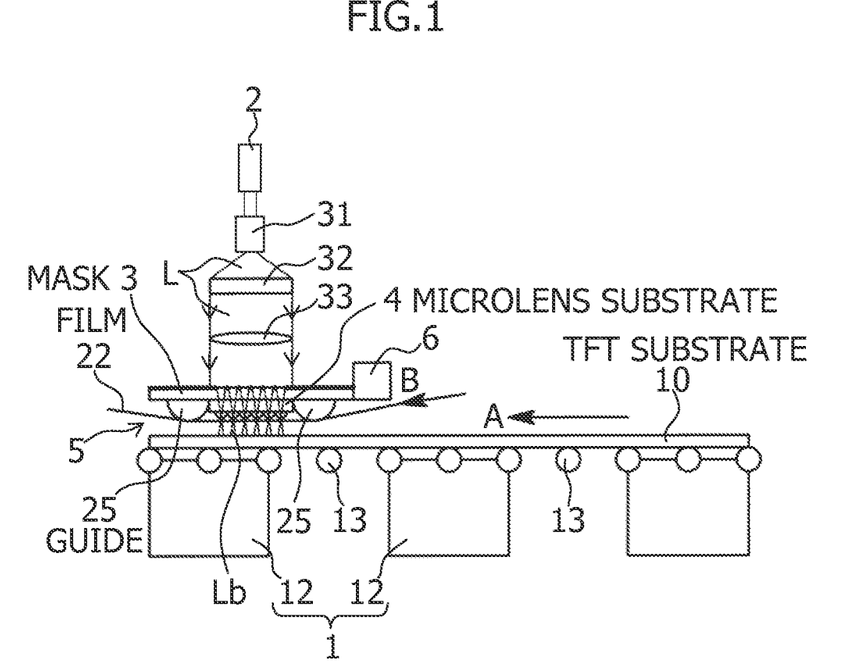
FIG. 1 is a front view illustrating an embodiment of a laser annealing apparatus according to the present invention.

FIG. 1 is a front view illustrating an embodiment of a laser annealing apparatus according to the present invention. The laser annealing apparatus irradiates an amorphous silicon film formed on a substrate with a plurality of laser beams through a plurality of microlenses to carry out a laser annealing treatment, and includes a scanning device 1, a laser source 2, a mask 3, a microlens substrate 4, an optical system protection device 5, and an alignment device 6.

Figure 2:
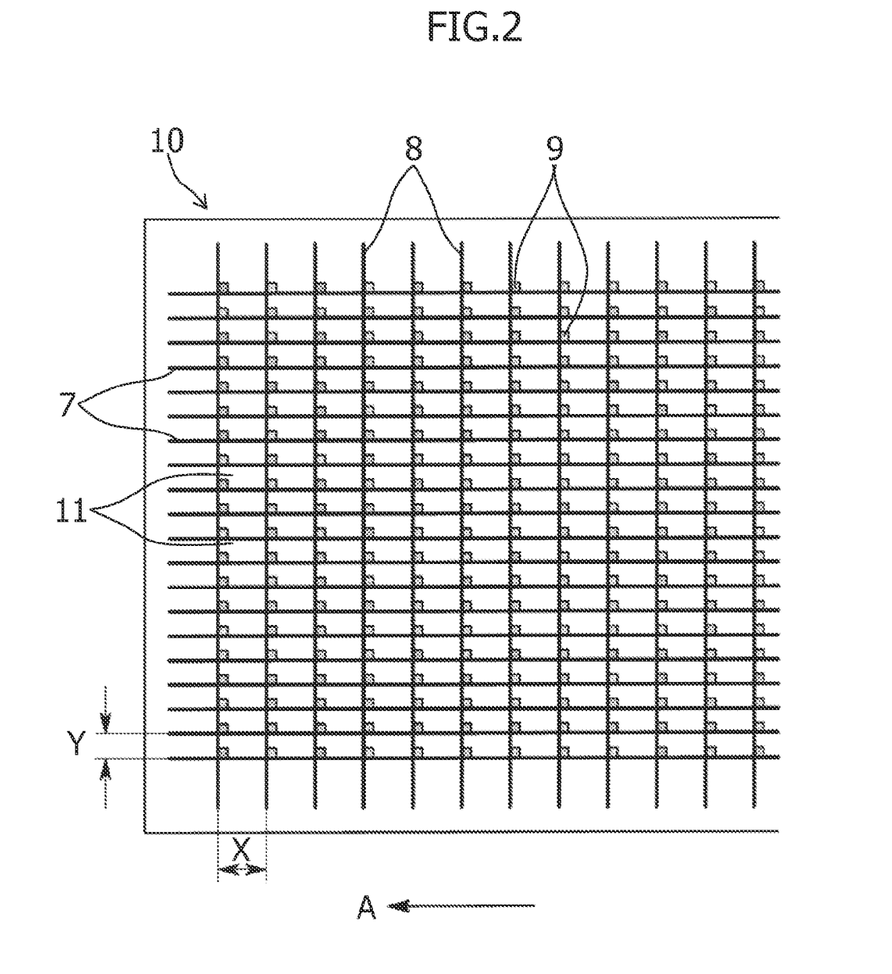
FIG. 2 is a plan view illustrating a TFT substrate to be subjected to a laser annealing treatment.

Here, as shown in FIG. 2, the substrate is a TFT substrate 10 on which a plurality of gate lines 7 and data lines 8 are formed horizontally and vertically, and a TFT-forming area 9 is set on a gate electrode (not illustrated) at every crossing of the data lines 7 and the gate lines 8. A plurality of TFT-forming areas 9 are set in a matrix with an array pitch (X in vertical direction and Y in horizontal direction) that is the same as that of pixels 11. Here, the moving direction of the TFT substrate 10 indicated by arrow A (hereinafter referred to as "substrate scanning direction") is designated as a vertical direction and a direction intersecting the direction is designated as a horizontal direction in this specification. On the TFT substrate 10, an alignment reference position is set, for example, at an edge of the gate line 7 parallel to the substrate scanning direction, and such an alignment reference becomes a reference for alignment of the TFT-forming areas 9 with apertures 16 of the mask 3 to be described later. In this embodiment, the alignment reference position is set at a right edge of the gate line 7 located at a left end toward the substrate scanning direction. At this time, a horizontal distance between the right edge of the gate line 7 and the center of the TFT-forming area 9 is determined by a design value. Here, although both of gate lines 7 and data lines 8 are shown in FIG. 2, only gate lines are present in the stage of laser annealing.

The scanning device 1 is for mounting the TFT substrate 10 on an upper surface thereof and moving the TFT substrate 10 at a constant speed in either one array direction of horizontal and vertical directions of the TFT-forming areas 9, for example, in the direction of arrow A in FIG. 2. A plurality of unit stages 12 having a plurality of ejection holes for ejecting gas and a plurality of suction holes for drawing gas in an upper surface thereof, is arranged parallel to the substrate scanning direction. The TFT substrate 10 is scanned with both edges thereof being supported by conveyor rollers 13, in a state that the TFT substrate 10 is floated off the plurality of unit stages 12 by a certain amount by using a balance between ejection and suction of the gas.

The laser source 2 is provided above the scanning device 1. The laser source 2 is an excimer laser that emits laser beams 14 having a wavelength of, for example, 308 nm or 353 nm with a repetition cycle of, for example, 50 Hz.

Figure 3A:
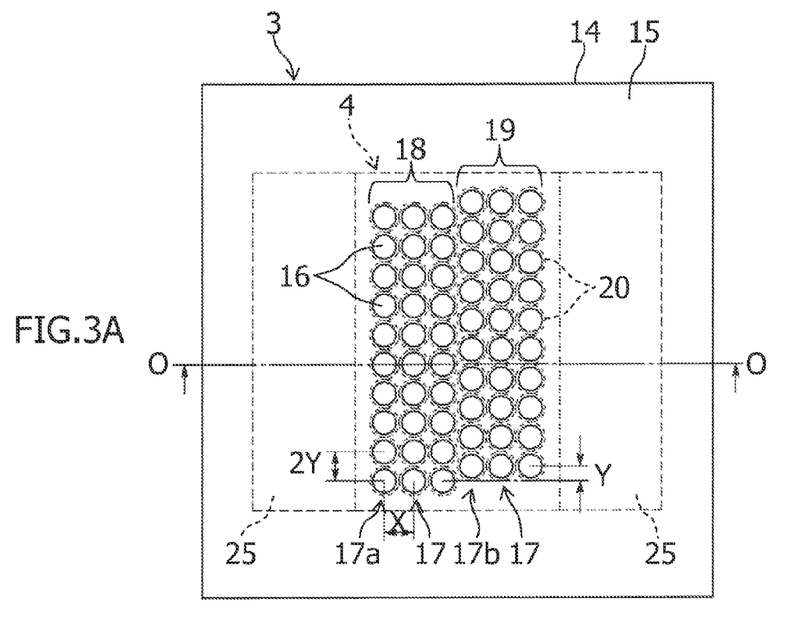
FIG. 3A is a plan view and FIG. 3B is an O-O line cross-sectional view observed from the arrows in FIG. 3A.
Figure 3B:
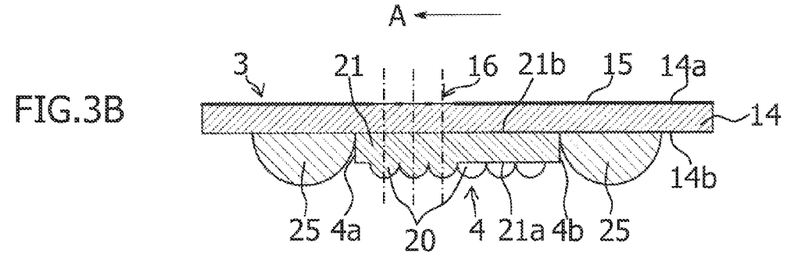

On an optical path of laser light L emitted from the laser source 2, a mask 3 is provided. The mask 3 is, as illustrated in FIG. 3, a transparent substrate such as a quartz substrate 14 having a surface 14a on which a light-shielding film 15 is formed, and through the light-shielding film 15, a plurality of apertures 16, each having a shape such as a circular shape similar to the shape of a TFT-forming area on the TFT substrate, are formed. As shown in FIG. 3A, for example, six aperture rows 17 are arranged in parallel at a pitch X, each of which is constituted by a plurality of apertures 16 arranged in a direction intersecting the substrate-scanning direction (arrow A direction) at a pitch (2Y in FIG. 3) that is an integer times and at least 2 times the arrangement pitch Y of the TFT-forming areas 9. With respect to the positions of three parallel aperture rows 17 present on the forward position in the substrate-scanning direction (hereinafter referred to as "first aperture group 18"), the positions of subsequent three aperture rows 17 (hereinafter referred to as "second aperture group 19") are staggered in the arrangement direction of the apertures 16 by a predetermined amount (Y in FIG. 3) so that intervals between the apertures 16 of the first aperture group 18 are filled by the second aperture group 19. The mask is disposed so that a surface 14b opposite from the surface 14a on which the light-shielding film 15 is formed is on the scanning device 1 side.

On the surface 14b of the mask 3 on the scanning device 1 side, a microlens substrate 4 is provided. This microlens substrate 4 focuses a plurality of laser beams Lb, that have passed through respective apertures 16 of the mask 3, onto a TFT substrate 10 through a plurality of microlenses to apply an optical energy of about 2 J/cm² to an amorphous silicon film. As shown in FIG. 3, on a surface 21a of a transparent substrate 21 having a size of about 10 mm to 15 mm in the substrate-scanning direction and having a size of about 50 mm in the direction intersecting the substrate-scanning direction, a plurality of microlenses 20 are formed (refer to FIG. 3A) at the same array pitch (X in vertical and 2Y in horizontal) as the plurality of apertures 16 formed in the mask 3, and the other surface 21b is bonded to a surface 14b of the mask 3 in a state that the optical axes of the microlenses are aligned to the centers of the apertures 16 of the mask 3 (refer to FIG. 3B). Here, the microlenses 20 preferably designed so that their back focal points are present between the tip of microlens 20 and a film 22, which will be described later, that passes under the microlens substrate 4, or between the film 22 and the substrate 21. In such a configuration, there is no risk that optical energy of laser beams Lb focused by the microlenses 20 will be absorbed into a silicon vapor produced by the annealing treatment and floating between the TFT substrate 10 surface and the film 22 to cause energy loss. Furthermore, since the focal points are not present on the film 22, there is no risk that the laser energy is concentrated on the film 22 to burn the film 22.

Figure 4:
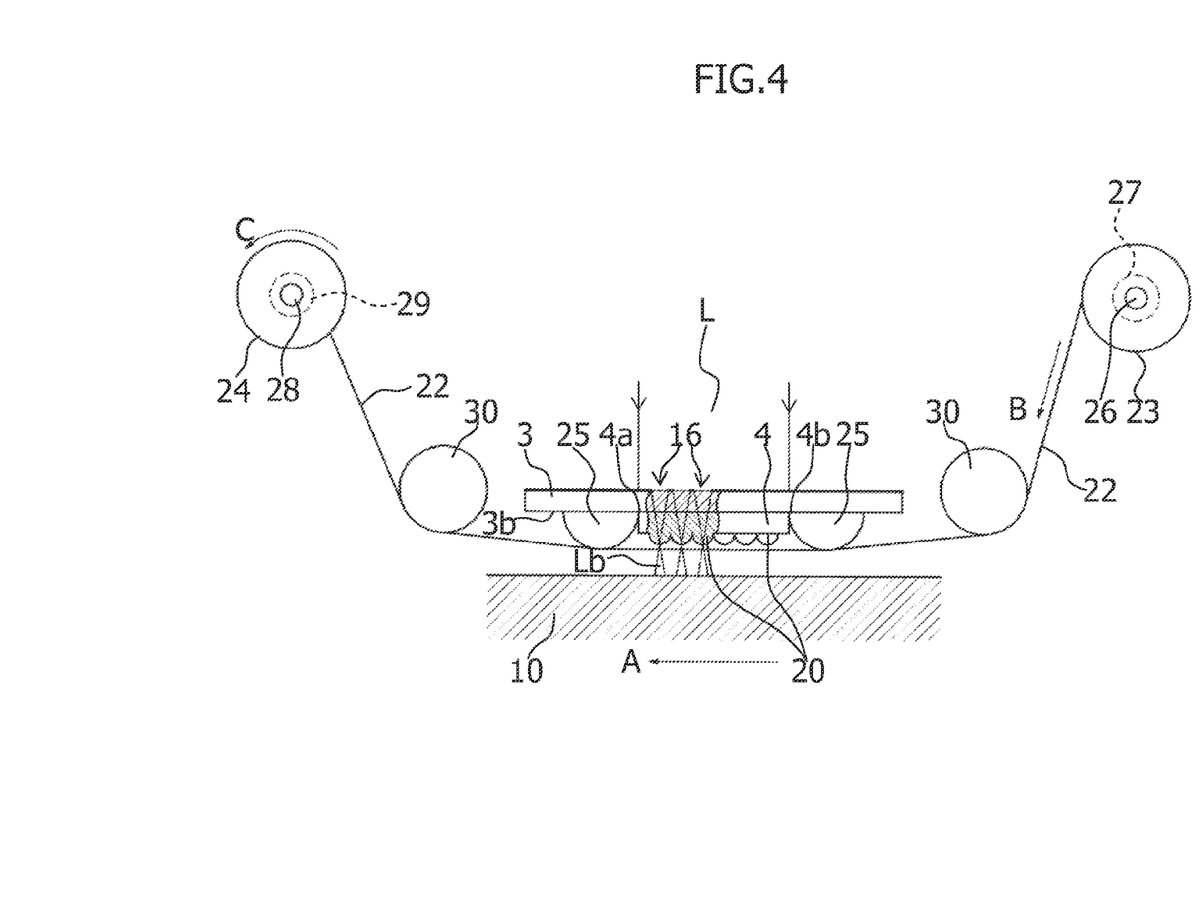
FIG. 4 is a partial cross-sectional front view illustrating an enlarged main part of the laser annealing apparatus according to the present invention.

Between the above microlens substrate 4 and the upper surface of the scanning device 1, an optical system protection device 5 is provided so that a film 22, that transmits the laser beams Lb, is movable. This optical system protection device 5 can prevent contaminants spread during an annealing treatment from adhering to the optical system. As illustrated in FIG. 4 that shows an enlarged main part of the laser annealing apparatus, the optical system protection device 5 includes a reel-out reel 23, a reel-in reel 24 and a pair of guides 25. In this case, as the above film 22, a film such as a polyethylene film having a UV transmittance of at least 90%, a laser durability of at least 10 J/cm² and a thickness of about 10 μm, is suitable.

In more detail, the above reel-out reel 23 is for reeling out a predetermined amount of wound film 22, and is configured to reel out the film in a state in which tension in the opposite direction to the feeding direction (arrow B direction) of the film 22 is always applied to the film 22 by a back tension motor 27, that is connected to a rotation shaft 26, so that a back tension is applied to the film. The reel-out reel 23 is provided on one side (upstream side of the mask 3 in the substrate scanning direction (arrow A direction) in FIG. 4) of the mask 3. Furthermore, a reel-in reel 24 is adapted to be rotated in arrow C direction by a reel-in motor 29, which is connected to a rotation shaft 28, to reel in the film 22, and is provided on the other side of the mask 3 from the reel-out reel 23. Furthermore, the pair of guides 25 suppresses generation of longitudinal wrinkles of the film 22 in the moving direction of the film 22 passing under the microlens substrate 4. The pair of guides each has a semi-cylindrical shape having a smooth surface and they are disposed on a lower surface 3b of the mask 3 along both sides 4a and 4b across the microlens substrate 4 so that the axes of the guides are substantially parallel to each other and that the tips of the guides protrude by a predetermined amount from the positions of tips of the microlenses 20 toward the scanning device 1 side (toward a TFT substrate 10 that passes underside). By this configuration, the film 22 can be moved continuously at a constant speed or intermittently with a constant amount at constant time intervals in a state that a constant back tension is applied to the film between the pair of guides 25. Here, in FIG. 4, the symbols 30 indicate guide rollers for changing the moving direction of the film 22 and stabilizing movement of the film 22.

An alignment device 6 is provided, which can make fine movement of the mask 3 and the microlens substrate 4 together in the direction intersecting the substrate-scanning direction. This alignment device aligns the centers of the apertures 16 of the mask 3 (or centers of microlenses 20) with the TFT-forming areas 9, and drive of the alignment device 6 is controlled by a control device, which is not shown.

Alignment by the alignment device 6 can be carried out in the following manner. That is, an image of the TFT substrate 10 is captured by a line camera, which is not shown, and has a plurality of photodiodes linearly arranged in a direction intersecting the substrate-scanning direction in a plane parallel to the upper surfaces of unit stages 12; the captured image is image-processed by an image processing unit in the control device to detect the position of an alignment reference of the TFT substrate 10; the distance between the position of the alignment reference and the image-capturing center of the line camera is compared with a target distance stored in a memory to compute a deviation amount; and the alignment device 6 is driven by the control device to move the mask 3 and the microlenses 20 together to correct the deviation amount. In this case, the image-capturing center of the line camera is aligned in advance to a reference position (for example, the center of any one of the apertures 16 of the mask 3) provided in the mask 3.

Here, in FIG. 1, a symbol 31 indicates a beam expander for expanding a diameter of a laser light L radiated from the laser source 2, the symbol 32 indicates a homogenizer for homogenizing an luminance distribution in a lateral cross-section of the laser light L, and the symbol 33 indicates a condenser lens for changing the laser light L into a parallel light to irradiate the mask 3 with the light.

Next, operation of the laser annealing apparatus having such a construction and a laser annealing method will be described.

First, a TFT substrate 10 on which an amorphous silicon film covering the entire surface is deposited, is positioned and placed on an upper surface of a scanning device 1 so that the amorphous silicon film is on the upper side and gate lines are parallel to the scanning direction.

Next, when a start switch is turned on, in a state in which the TFT substrate 10 is floated off a unit stage 12 of the scanning device 1, the scanning device 1 is pulse-controlled by a control device, which is not illustrated, to scan the TFT substrate 10 in an arrow A direction shown in FIG. 1 at a constant speed.

Subsequently, an image of a surface of the TFT substrate, that is moving, is sequentially captured, and a captured single dimension image is processed by an image processing unit of the control device in real time, an alignment reference position (for example, a right side edge of a leftmost gate line 7 when it is observed toward the substrate-scanning direction in FIG. 2), that has been provided on the TFT substrate 10 in advance, is detected based on a luminance change in an array direction of a plurality of photodiodes of the line camera, and the distance between the detected alignment reference position and an image-capturing center is computed. Subsequently, the computed result is compared with a target value, which has been set and stored in advance, to compute a deviation amount from the target value. Then, the alignment device 6 is driven and controlled by the control device to move the mask 3 in the direction intersecting the substrate-scanning direction so as to correct the above deviation amount to thereby align the mask 3 to the TFT substrate 10. By this method, it is possible to align the mask 3 to the TFT substrate 10 that is moving while varying in the lateral direction.

When the TFT substrate 10 has moved and a row of TFT-forming areas 9 on the front side in the substrate-scanning direction reach a position right under a front side aperture row 17*b* of a second aperture group 19 of the mask 3 in the scanning direction, the laser source 2 is lit for a predetermined duration to irradiate the mask 3 with the laser light L. Then, a plurality of laser beams Lb that passes through a plurality of apertures 16 of the mask 3 are focused on the TFT substrate 10 by a plurality of microlenses 20 to anneal an amorphous silicon film in TFT-forming areas 9 corresponding to the second aperture group 19, thus changing the amorphous silicon into polysilicon.

Figure 5A:
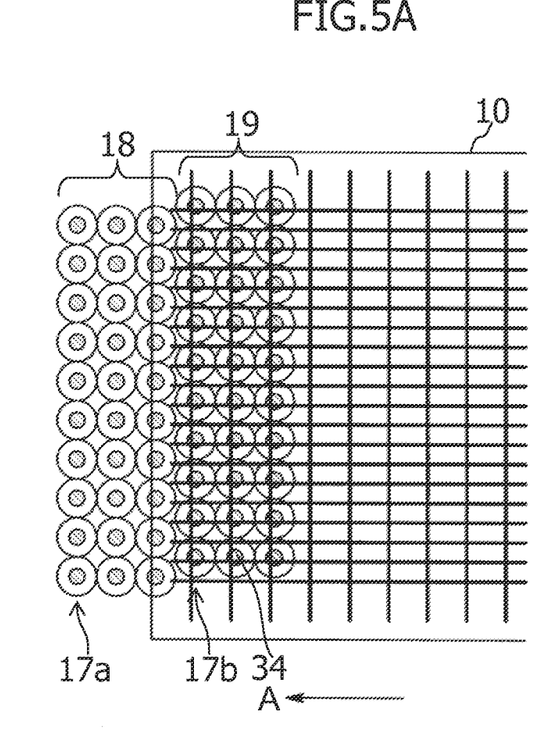
FIGS. 5A and 5B are an explanatory view illustrating a laser annealing treatment by the laser annealing apparatus of the present invention.
Figure 5B:
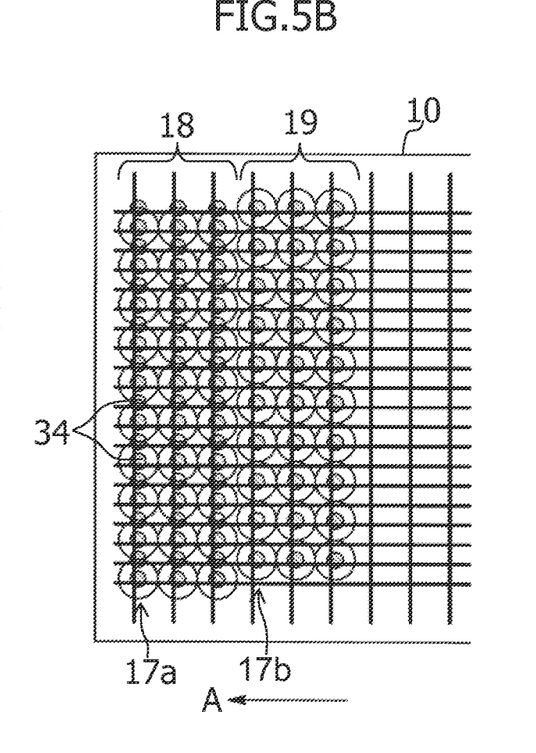

Every time the TFT substrate 10 is moved by a distance that equals a distance 3X between aperture rows 17*a* and 17*b*, that are positioned on a downstream side in the substrate-scanning direction of the first aperture group 18 and the second aperture group 19, respectively, of the mask 3, the laser source 2 is lit for a predetermined period. Consequently, all TFT-forming areas 9 set on the TFT substrate 10 are annealed one after another to form a polysilicon film 34. Here, FIG. 5B illustrates a state in which the TFT substrate 10 has been moved by the distance 3X from the state of FIG. 5A, and that TFT-forming areas 9 between TFT-forming areas 9 corresponding to the second aperture group 19 have been annealed by the first aperture group 18.

In such an annealing treatment, a part of amorphous silicon film is vaporized by irradiation with the laser beams Lb and is floating between the TFT substrate 10 surface and the microlens substrate 4, and such a silicon vapor adheres to surfaces of microlenses 20 as contaminants to lower the transmittance to the laser beams Lb in some cases. Under the circumstances, in the present invention, an optical system protection device 5 is provided, and by means of a film 22 moving between the microlens substrate 4 and an upper surface of the scanning device 1 (or the TFT substrate 10), adhesion of contaminants to the microlens substrate 20 is prevented. Operation of the optical system protection device 5 will be described below.

First, a reel-in motor 29 operates to rotate a reel-in reel 24 in an arrow C direction illustrated in FIG. 4 to reel-in a film 22. Consequently, the film 22 provided between a pair of guides 25 provided along both sides 4*a* and 4*b* across the microlens substrate 4 moves continuously at a constant speed or intermittently with a constant amount at constant time intervals. Accordingly, the silicon vapor (contaminants), that has been vaporized by irradiation with the laser beams Lb and is floating between the TFT substrate 10 surface and the microlens substrate 4, adheres to the film 22 surface and does not adhere to surfaces of the microlenses 20. At this time, since the film 22 moves continuously at a constant speed or intermittently with a constant amount at constant time intervals, a film 22 surface to which the contaminants adhere and contaminated more than a tolerable value moves to the downstream side, and a film 22 surface having a transmittance higher than a predetermined level is always present under the microlens substrate 4. Accordingly, the transmittance to the laser beam Lb is always maintained to be at least a tolerable value and a laser annealing treatment can be performed appropriately. Here, from an experiment, it has become clear that 1000 shots of laser beam Lb irradiation decreases the transmittance of the film 22 by about 7% of a tolerance limit of transmittance. Accordingly, for example, the film 22 is preferably moved by an amount corresponding to the distance between the pair of guides 22 each time after 1000 shots of the laser beam Lb has been irradiated.

At this time, a back tension motor 27 connected to a rotation shaft 26 of a reel-out reel 23 produces a torque in a direction opposite to the feeding direction of the film 22 indicated by an arrow B in FIG. 4 to apply a tension in the direction opposite to the feeding direction to the film 22. Accordingly, a back tension is applied to the film 22, so that the film 22 is provided between the pair of guides 25 in a tensioned state. Here, since the distance between the pair of guides 25 can be far narrower than the distance between a pair of rolls of prior art, even if such a back tension is applied to the film, it is possible to suppress generation of longitudinal wrinkles parallel to the moving direction of the film 22 in a portion of the film between the guides 25. Accordingly, a shape of irradiation pattern of each laser beam Lb transmitted through the film 22 and irradiated onto the TFT substrate 10 is maintained to be substantially the same as the shape of each aperture 16 of the mask 3, and an annealing treatment can be carried out to TFT-forming areas 9 of the TFT substrate 10 with good accuracy.

When a series of annealing treatments in the substrate-scanning direction is completed, the TFT substrate 10 is returned to a start position at a high speed. Thereafter, the TFT substrate is step-moved in a direction intersecting the substrate-scanning direction, and an annealing treatment to an adjacent area is carried out in the same manner as above. This procedure is repeated to carry out an annealing treatment on the entire surface of the TFT substrate 10. As an alternative, when a first annealing treatment in the arrow A direction is completed, the TFT substrate 10 may be step-moved a predetermined distance in the direction intersecting the substrate-scanning direction relatively to the mask 3, and thereafter, the scanning direction may be reversed so that an annealing treatment on an adjacent area is carried out in the same manner as described above while the TFT substrate is scanned in a direction opposite to the arrow A direction.

In any of the above cases, for example, a photosensor may be provided at an end position in the substrate-scanning direction, and when a first annealing treatment to the TFT substrate 10 is completed, the transmittance of the film 22 may be measured to estimate a tolerable shot number of the laser beams Lb. Specifically, a first annealing treatment is carried out while the substrate is scanned to the end position in state in which movement of the film 22 is stopped, and thereafter, the transmittance of the film 22 is measured to compute a reduction of the transmittance of the film 22, and based on the number of shots of the laser beams Lb in the first annealing treatment, a tolerable number of shots corresponding to tolerable reduction of transmittance is estimated. Thereafter, each time the number of shots of laser beams Lb reaches the estimated tolerable shot number, the film 22 is step-moved by a predetermined amount. By this method, since the tolerable shot number of the laser beams Lb for judging a timing of the step movement of the film 22 is determined according to real measurement value of the transmittance of the film 22, it is possible to stably maintain the transmittance of the film 22 to be at least a predetermined value and to always appropriately carry out an annealing treatment.

Here, in the above description, explanation has been made with respect to a case in which the TFT substrate 10 is a substrate for a display device, but the present invention is not limited thereto, and the substrate may be may one such as a semiconductor substrate on which an amorphous silicon film is formed.

What is claimed is:

1. A laser annealing apparatus which irradiates an amorphous silicon film formed on a substrate with a plurality of laser beams to carry out an annealing treatment, the apparatus comprising:
    a mask having a plurality of apertures each having a shape similar to that of an area of the substrate to be annealed;
    a microlens substrate having a plurality of microlenses arranged on a plane and configured to focus the plurality of laser beams, that have passed through the respective apertures of the mask, onto the substrate to apply a predetermined energy to the amorphous silicon film;
    a pair of guides each having a semi-cylindrical shape and disposed along both sides across the microlens substrate so that the axes of the guides are parallel to each other and that the tips of the guides protrude from the positions of tips of the microlenses toward the substrate; and
    a film that is provided in a tensioned state between the pair of guides so as to be movable and that transmits the laser beams.

2. The laser annealing apparatus according to claim 1, further comprising a reel-out reel, that is disposed on one side of the mask and reels out the film, and a reel-in reel, that is disposed on the other side of the mask and reels in the film, wherein it is possible to move the film continuously at a constant speed or intermittently with a constant amount at constant time intervals in a state that a constant back tension is applied to the film between the pair of guides.

3. The laser annealing apparatus according to claim 1, further comprising a scanning device for moving the substrate in a direction intersecting the axes of the pair of guides at a constant speed.

4. The laser annealing apparatus according to claim 1, wherein the substrate is a thin-film transistor (hereinafter, referred to as "TFT") substrate for a display device, and the area to be annealed is a TFT-forming area.

5. The laser annealing apparatus according to claim 1, wherein the microlenses are each formed so as to have a focal point between the tip of the microlens and the film or between the film and the mask.

6. A laser annealing method of irradiating an amorphous silicon film formed on a substrate with a plurality of laser beams through a mask having a plurality of apertures each having a predetermined shape and a microlens substrate having a plurality of microlenses formed so as to correspond to the plurality of apertures of the mask, and carrying out an annealing treatment, by the laser annealing apparatus according to claim 1, the method comprising steps of:
    moving a film, that is provided in a tensioned state between a pair of guides so as to be movable and that transmits the laser beams, in a direction intersecting the axes of the pair of guides, the pair of guides each having a semi-cylindrical shape and disposed along both sides across the microlens substrate so that the axes of the guides are parallel to each other and that the tips of the guides protrude from the positions of tips of the microlenses toward the substrate;
    moving the substrate in the moving direction of the film at a constant speed in a state that the substrate faces to the microlens substrate; and
    focusing the plurality of laser beams that have passed through the plurality of microlenses and have been transmitted through the film, onto the substrate to apply the amorphous silicon film with a predetermined optical energy.

* * * * *